United States Patent
Shiao et al.

(10) Patent No.: US 6,440,792 B1
(45) Date of Patent: *Aug. 27, 2002

(54) DRAM TECHNOLOGY OF STORAGE NODE FORMATION AND NO CONDUCTION/ISOLATION PROCESS OF BOTTLE-SHAPED DEEP TRENCH

(75) Inventors: Jia S. Shiao; Wen B. Yen, both of Hsinchu (TW)

(73) Assignees: Promos Technology, Inc.; Mosel Vitelic Inc., both of Hsinchu (TW); Siemens AG, Munich (DE)

(*) Notice: Subject to any disclaimer, the term of this patent is extended or adjusted under 35 U.S.C. 154(b) by 0 days.

This patent is subject to a terminal disclaimer.

(21) Appl. No.: 09/552,027

(22) Filed: Apr. 19, 2000

(51) Int. Cl.[7] .......................................... H01L 21/8242
(52) U.S. Cl. ...................... 438/243; 438/249; 438/386; 438/392
(58) Field of Search ................................. 438/243, 246, 438/247, 248, 249, 386, 389, 390, 391, 392

(56) References Cited

U.S. PATENT DOCUMENTS

| | | | | |
|---|---|---|---|---|
| 6,008,104 A | * | 12/1999 | Schrems | 438/386 |
| 6,018,174 A | * | 1/2000 | Schrems et al. | 257/296 |
| 6,200,851 B1 | * | 3/2001 | Arnold | 438/243 |
| 6,232,171 B1 | * | 5/2001 | Mei | 438/246 |
| 6,271,079 B1 | * | 8/2001 | Wei et al. | 438/243 |

* cited by examiner

*Primary Examiner*—Michael Trinh
(74) *Attorney, Agent, or Firm*—W. Wayne Liauh

(57) ABSTRACT

An improved method for reducing the cost of fabricating bottle-shaped deep trench capacitors. It includes the steps of: (a) forming a deep trench into a semiconductive substrate; (b) filling the deep trench with a first dielectric material to a first predetermined depth; (c) forming a silicon nitride sidewall spacer in the deep trench above the dielectric layer; (d) removing the first dielectric layer, leaving the portion of the substrate below the sidewall spacer to be exposed; (e) using the sidewall spacer as a mask, causing the exposed portion of the substrate to be oxidized, then removing the oxidized substrate; (f) forming an arsenic-ion-doped conformal layer around the side walls of the deep trench, including the sidewall spacer; (g) heating the substrate to cause the arsenic ions to diffuse into the substrate in the deep trench not covered by the sidewall spacer; (h) removing the entire arsenic-ion-doped layer; (i) forming a conformal second dielectric layer covering the surface of the deep trench including the sidewall spacer, then filling the deep trench with a first conductive material to a second predetermined depth which is above the first predetermined depth; (j) removing the sidewall spacer and the second dielectric layer above the second predetermined depth; and (k) filling the deep trench with a second conductive material. The present invention allows several cycles of deposition/controlled etching to be eliminated while improving the quality of the deep trench capacitors.

9 Claims, 6 Drawing Sheets

US 6,440,792 B1

DRAM TECHNOLOGY OF STORAGE NODE FORMATION AND NO CONDUCTION/ISOLATION PROCESS OF BOTTLE-SHAPED DEEP TRENCH

FIELD OF THE INVENTION

The present invention relates to a novel method for making bottle-shaped deep trench for use as storage node in sub-micron-sized semiconductor devices. More specifically, the present invention relates to an improved method for fabricating storage nodes into a sub-micron-sized semiconductor substrate, the storage node having the form of a bottle-shaped deep trench with an enlarged diameter, or more generally speaking, with enlarged circumference or cross-sectional area in the bottom portion thereof. The method disclosed in the present invention greatly simplifies the manufacturing procedure by eliminating and replacing many of the complicated steps required in the conventional processes, while allowing the storage capacity of the deep trench capacitor to remain the same or even be increased. The present invention also relates to the improved sub-micron semiconductor deep-trench storage node made from the novel process, and the semiconductors incorporating the same.

BACKGROUND OF THE INVENTION

A capacitor comprises a dielectric layer sandwiched by a pair of spaced conducting plates. There are two basic types of capacitors provided in a semiconductor device, for example, dynamic random access memory (DRAM): the crown-type capacitors and the deep-trench type capacitors. As the trend in the fabrication of semiconductor devices is toward ever-increasing density of circuit components that can be tightly packed per unit area, there are great demands to develop technologies that can reduce the surface area to be taken by individual circuit components. As a result, deep trench technologies have been developed which result in structures, particularly large area capacitors, that are vertically oriented with respect to the plane of the substrate surface.

A deep trench capacitor typically comprises a dielectric layer formed on the sidewalls of a deep trench, which is formed into and surrounded by a highly doped buried plate (which constitutes the first conducting plate), and a highly doped poly fill (which constitutes the second conducting plate), which fills the deep trench. The dielectric layer separates the first and the second conducting plates. The capacitance of the deep trench capacitor is determined by the total sidewall surface of the trench, which, in turn, is determined by the diameter, or more specifically the circumference, of the deep trench. As the semiconductor fabricating technology moves into the sub-micron or even deep sub-micron range, it is increasingly recognized that the present technology for making deep trench capacitors may be inadequate. For deep sub-micron semiconductor devices, a deep trench can have a length-to-width aspect ratio of 35:1 or even greater. With current technology, the diameter (or width or circumference) of the trench generally decreases with depth. Such a tapered cross-sectional area causes a significant decrease in the overall sidewall surface of the trench, and, consequently, the capacitance provided by the deep trench capacitor. This problem is expected to become even more profound as we move into the next generation of ULSI fabrication technologies that are characterized with critical dimensions of 0.15-micron or even finer.

Several techniques have been developed for fabricating the so-called bottle-shaped deep trench capacitors. All these techniques are relatively complicated and involve repeated applications of chemical vapor deposition, controlled etching, etc., as well as the need for using photoresists. FIG. 1 shows a typical bottle-shaped deep trench capacitor fabricated using the prior art process.

FIG. 1 shows that a conventional bottle-shaped deep trench 106 includes an enlarged bottom portion 112a, which is filled with a first conducting material. The bottle-shaped deep trench 106 is formed into a semiconductive substrate 100. A diffused zone 118 serves a first conducting plate. The diffused zone 118 is separated from the first conducting material in the bottom portion by a pad oxide layer 120a. FIG. 1 also shows another pad oxide layer 102 and a hard mask layer 104, both of which are required in forming the deep trench.

As discussed above, the conventional processes involve repeated applications of chemical vapor deposition, recessing, and etching, and the resultant bottle-shaped deep trench capacitor typically contains a second conducting plate which is made of three conducting layers (which can also be appropriately called "sections", since they are stacked above one another). All these three layers can be made of the same material and may look as if the second conducting plate contains only an integrated layer. However, it is important to note that, due to the process steps involved, the second conducting plate typically contains conducting layers that are formed in three separate stages. The second conducting layer 126 is formed after the formation of the first conducting layer 112a, and a collar oxide 124. The third conducting layer 128, which is in contact with the semiconductive substrate 100, is formed after the removal of part of the collar oxide 124 and the corresponding part of the second conducting layer 126. Thus, with the conducting layers alone, the conventional processes involve at least three cycles of deposition and controlled etching. It may be possible to reduce the number of deposition/etching cycles involved in the formation of the conductive layers, but this may result in other process complexities.

In order to meet consumers' demand and expectation of continual lowered price of electronic components, it is necessary to find ways that can significantly simplify the semiconductor fabrication process so as to reduce the manufacturing cost. This is particularly important for the fabrication of some of the most common devices such as DRAM. It is equally important to develop processes that will also improve the integrity of the resultant products, so as to reduce the failure rate and further lower the fabrication cost.

SUMMARY OF THE INVENTION

The primary object of the present invention is to develop an improved process for the manufacturing of bottle-shaped deep trench capacitors which will reduce the fabrication cost while maintaining or even improving product performance and yield rate. More specifically, the primary object of the present invention is to develop an improved process which minimizes the number of deposition/controlled etching cycles required for the manufacturing of bottle-shaped deep trench capacitors without adversely affecting the performance of the resultant product. In fact, the modifications made in the process of the present invention actually improve the integrity of the bottle-shaped deep trench capacitor, resulting in not only cost savings but also increased product yield.

The process disclosed in the present invention for the fabrication of bottle-shaped deep trench capacitors includes the following main steps:

(1) Forming a pad oxide layer and a hard mask layer on the surface of a semiconductive substrate;
(2) Using a photolithography process to form a vertically elongated trench (i.e., deep trench) through the oxide and hard mask layers and into the substrate;
(3) Partially filling the deep trench with a first dielectric material to form a first dielectric layer having a first predetermined depth intended for the deep trench capacitor;
(4) Forming a sidewall spacer in the deep trench above the dielectric layer, the sidewall spacer being made from a second dielectric material having a different etchability from the first dielectric material as well as allowing low diffusion rate for ions;
(5) Removing the first dielectric layer;
(6) Using the sidewall spacer as a mask, causing the exposed portion (i.e., the bottom portion below the first predetermined depth) of the substrate in the deep trench to be oxidized, then removing the oxidized substrate;
(7) Forming an ion-doped conformal layer around the side walls of the deep trench, including the sidewall spacer and extending to the hard mask layer;
(8) Heating the substrate to cause doping ions to diffuse into the substrate in the deep trench not covered by the sidewall spacer, the diffused region becomes the first conductive plate;
(9) Removing the entire ion-doped conformal layer;
(10) Forming a conformal second dielectric layer covering the surface of the deep trench including the sidewall spacer, then filling the deep trench with a first conductive material to a second predetermined depth which is above the first predetermined depth;
(11) Removing the sidewall spacer and the second dielectric layer above the second predetermined depth; and
(12) Filling the deep trench with a second conductive material.

With the process of the present invention, because the ion-doped layer is formed on the sidewall spacer, there is no need to remove the upper portion of the ion-doped layer prior to performing the diffusion step, which is required in the prior art processes. The steps of filling the first and second conductive materials involve filling the deep trench with an appropriate conductive material then etching the conductive material to respectively desired depths. Because the neck portion of the deep trench is already protected by the sidewall spacer, there is no need to form an oxide collar in the present invention. Furthermore, because the uppermost conductive layer must be in contact with the semiconductive substrate, and because the oxide collar is formed after the formation of the first conducting layer, the prior art processes required the step of forming an intermediate conductive layer which is defined by the oxide collar and is not in contact with the substrate, then removing the upper portion of the oxide collar. The present invention eliminates the need for such intermediate step. The presence of the nitride layer between the first and second predetermined depths further improves the insulation between the first and second conductive plates, and thus improving the integrity of the final product.

BRIEF DESCRIPTION OF THE DRAWING

The present invention will be described in detail with reference to the drawing showing the preferred embodiment of the present invention, wherein:

FIG. 2A is an illustrative schematic diagram showing that a deep trench is formed into a semiconductive substrate.

FIG. 2B is an illustrative schematic diagram showing that the deep trench is filled with a first dielectric material to a first predetermined depth intended for a deep trench capacitor.

FIG. 2C is an illustrative schematic diagram showing that a sidewall spacer is formed in the deep trench above the first predetermined depth.

FIG. 2D is an illustrative schematic diagram showing that after the removal the first dielectric layer, the exposed portion of the substrate in the deep trench is oxidized, using the sidewall spacer as a mask, to a predetermined distance into the substrate.

FIG. 2E is an illustrative schematic diagram showing that a bottle-shaped deep trench is formed after the removal oxidized substrate formed in the step shown in FIG. 2D.

FIG. 2F is an illustrative schematic diagram showing that a conformal heavily ion-doped layer is formed which covers the surface of the deep trench including the sidewall spacer.

FIG. 2G is an illustrative schematic diagram showing that the doping ions in the ion-doped layer are caused to diffuse into the substrate except for those areas that are covered by the sidewall spacer, followed by the removal of the ion-doped layer.

FIG. 2H is an illustrative schematic diagram showing that after the formation of a conformal second dielectric layer which covers the surface of the deep trench including the sidewall spacer, the deep trench is filled with a first conductive material above the top surface of the hard mask covering the substrate.

FIG. 2I is an illustrative schematic diagram showing that the first conductive material is controlledly etched to a second predetermined depth which is above the first predetermined depth.

FIG. 2J is an illustrative schematic diagram showing that after the removal of the second dielectric layer above the second predetermined depth, the deep trench is filled with a second conductive material.

DETAILED DESCRIPTION OF THE PREFERRED EMBODIMENT

The present invention discloses an improved process for the manufacturing of bottle-shaped deep trench capacitors which simplifies the fabrication steps and thus allowing the fabrication cost to be substantially reduced while maintaining or even improving the product quality and the production yield rate. The fabrication process disclosed in the present invention reduces the number of deposition/recessing/etching cycles required for the manufacturing of bottle-shape deep trench capacitors without adversely affecting the performance of the resultant product. The modifications made in the process of the present invention actually improve the integrity of the bottle-shaped deep trench capacitor, resulting in not only cost savings but also increased production yield.

Figure 1:
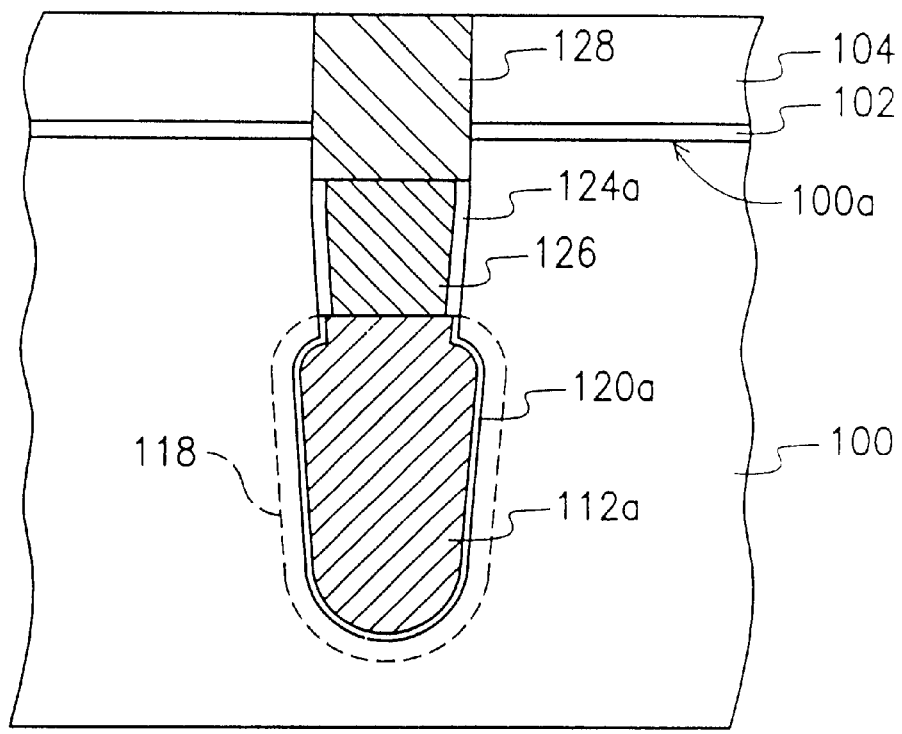
FIG. 1 is an illustrative schematic diagram showing a prior art bottle-shaped deep trench capacitor.

Substantial differences can be realized by looking at FIGS. 1 (prior art) and 2J (the present invention). For example, in the prior art deep trench capacitors, the first conducting plate comprises three conductive layers (or vertical sections) that are formed in three separate deposition/ etching cycles. The present invention only requires two of such deposition/etching cycles. As another example, in the prior art deep trench capacitors, an oxide collar is required after the removal of the dielectric layer above the bottom portion. In the present invention, in comparison, the dielectric layer is formed on top of the sidewall spacer. Not only the present invention eliminates many arduous steps in the prior art processes, it also enhances the insulation between the first and second conductive plates, thus, improving the product quality.

The process disclosed in the present invention for the fabrication of bottle-shaped deep trench capacitors includes the following main steps:

(1) Forming a pad oxide layer and a hard mask layer on the surface of a semiconducting substrate. Preferably, the pad oxide layer has a thickness of about 50 Å, and the hard mask layer, which can be made of silicon nitride or a mixture of silicon nitride/oxide using a chemical vapor deposition method, has a thickness of 2,000 Å.

(2) Using a photolithography process in conjunction with a photoresist to form a vertically elongated trench (i.e., deep trench) through the oxide and hard mask layers and into the substrate.

(3) Partially filling the deep trench with a first dielectric material to form a first dielectric layer having a first predetermined depth intended for the deep trench capacitor. Preferably, this step is achieved by first filling the deep trench with the first dielectric material, then removing a portion of it to the first predetermined depth.

(4) Forming a sidewall spacer in the deep trench above the dielectric layer, the sidewall spacer being made from a second dielectric material having a different etchability from the first dielectric material as well as allowing low diffusion rate for ions. The sidewall spacer can be formed by a conformal deposition of a hard dielectric material such as silicon nitride followed by anisotropic etching to a thickness of about 200 Å.

(5) Removing the first dielectric layer by a selective etching technique which does not affect the sidewall spacer. This will leave the bottom portion of the deep trench, i.e., the portion intended to be enlarged, to be exposed.

(6) Using the sidewall space as a mask, causing the exposed portion of the substrate in the deep trench to be oxidized by, for example, an RTP process under an oxygen environment. The oxidized substrate, i.e., silicon oxide, can be removed by wet etching. This causes the bottom portion of the deep trench to be enlarged.

(7) Using a combined in-situ ion-doping and chemical vapor deposition technique to form an ion-doped conformal layer around the side walls of the deep trench, including the sidewall spacer and extending to the hard mask layer. Preferably the doping ions are arsenic ions.

(8) Heating the substrate to cause the doping ions to diffuse into the substrate in the deep trench not covered by the sidewall spacer, the diffused region becomes the first conductive plate. One of the main differences between the present invention and the prior processes is that the method of the present invention does not have to remove the upper portion of the ion-doped layer before the diffusion step. This allows the elimination of a significant step in the fabrication of bottle-shaped deep trench capacitors.

(9) Removing the entire ion-doped layer using BHF (buffered hydrofluoric acid) or DHF (diluted hydrofluoric acid). Because the diffused layer is pushed away from the original trench surface, it results in about 50% to 100% increase in the surface of the deep trench capacitor.

(10) Forming a conformal second dielectric layer which covers the surface of the deep trench including the sidewall spacer. The second dielectric layer provides the insulation between the first conductive plate, which is the diffused zone, and the second conductive plate to be formed subsequently. This step is followed by filling the deep trench with a first conductive material and controlledly etching the first conductive material to a second predetermined depth which is above the first predetermined depth. During the etching step, since the neck portion is already covered by the hard sidewall spacer, there is no need to form an oxide collar. The present invention also eliminates the need to form an intermediate conductive layer between the first and second predetermined depths.

(11) Removing the sidewall spacer and the second dielectric layer above the second predetermined depth by selective etching which does not affect the conductive material.

(12) Filling the deep trench with a second conductive material. Excess amount of the second conductive material can be removed by chemical-mechanical polishing (CMP). As discussed before, because the hard sidewall is present behind the second dielectric layer, The present invention also eliminates the need to form an intermediate conductive layer between the first and second predetermined depths, as required in prior art processes.

The present invention will now be described more specifically with reference to the following examples. It is to be noted that the following descriptions of examples, including the preferred embodiment of this invention, are presented herein for purposes of illustration and description, and are not intended to be exhaustive or to limit the invention to the precise form disclosed.

EXAMPLE 1

FIGS. 2A–2J illustrate an example of the main steps for forming a bottle-shaped deep trench capacitor according to a preferred embodiment of the present invention. Each of these steps is described in more detail below.

Figure 2A:
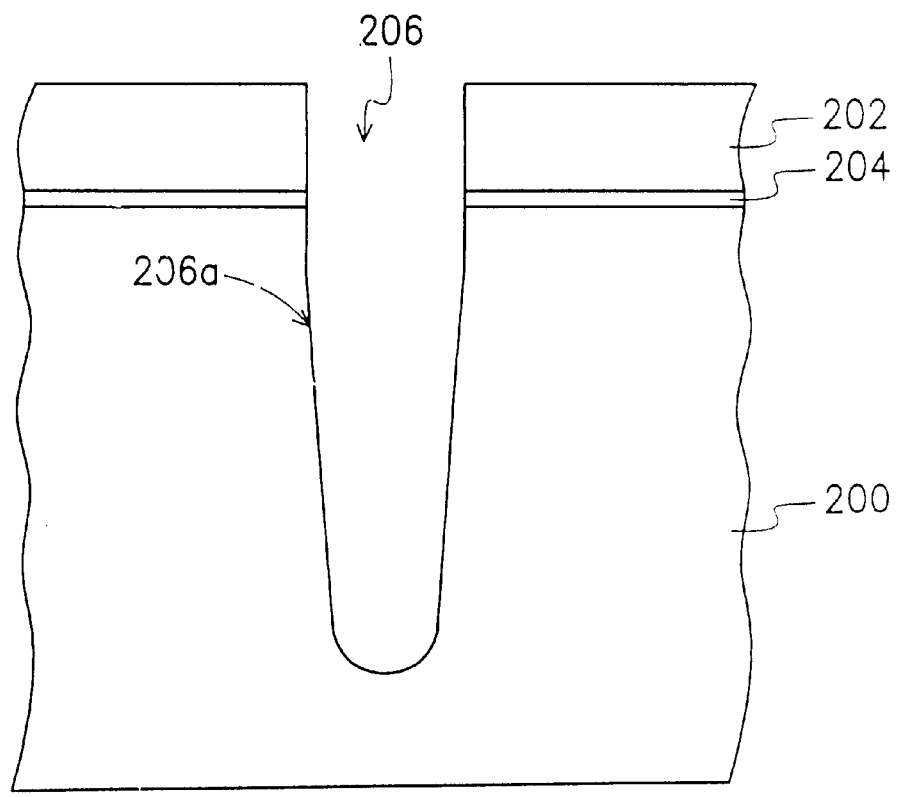
FIGS. 2A–2J are illustrative schematic diagrams showing the main steps of forming a bottle-shaped deep trench capacitor according to a preferred embodiment of the present invention.

FIG. 2A shows that a deep trench 206 is formed, using a photolithography process, into a semiconductive substrate 200 with an exposed surface 206a in the deep trench. The length-to-width ration is about 35. Prior to the formation of the deep trench 206, a pad oxide layer 204 and a hard mask layer 202 were formed on the surface of the semiconducting substrate. The pad oxide layer has a thickness of about 50 Å, and the hard mask layer, which can be made of silicon nitride or a mixture of silicon nitride/oxide using a chemical vapor deposition method, has a thickness of 2,000 Å.

Figure 2B:
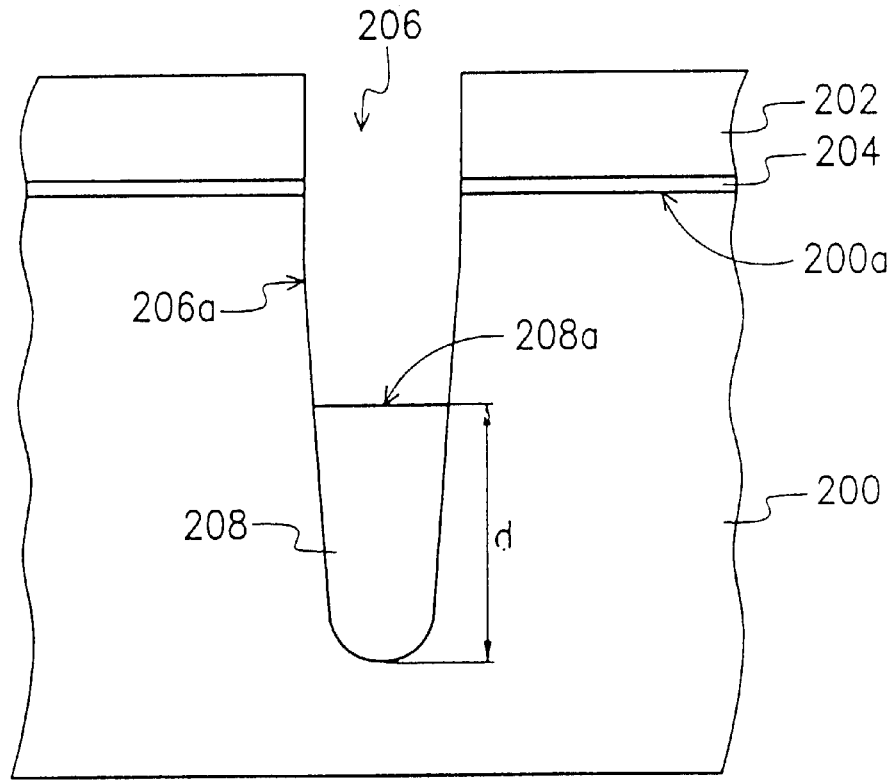

FIG. 2B shows that the deep trench is filled with a first dielectric material 208 to a first predetermined depth "d" intended for a deep trench capacitor. This step is achieved by first filling the deep trench with the first dielectric material, then etching it in a controlled manner to the first predetermined depth.

Figure 2C:
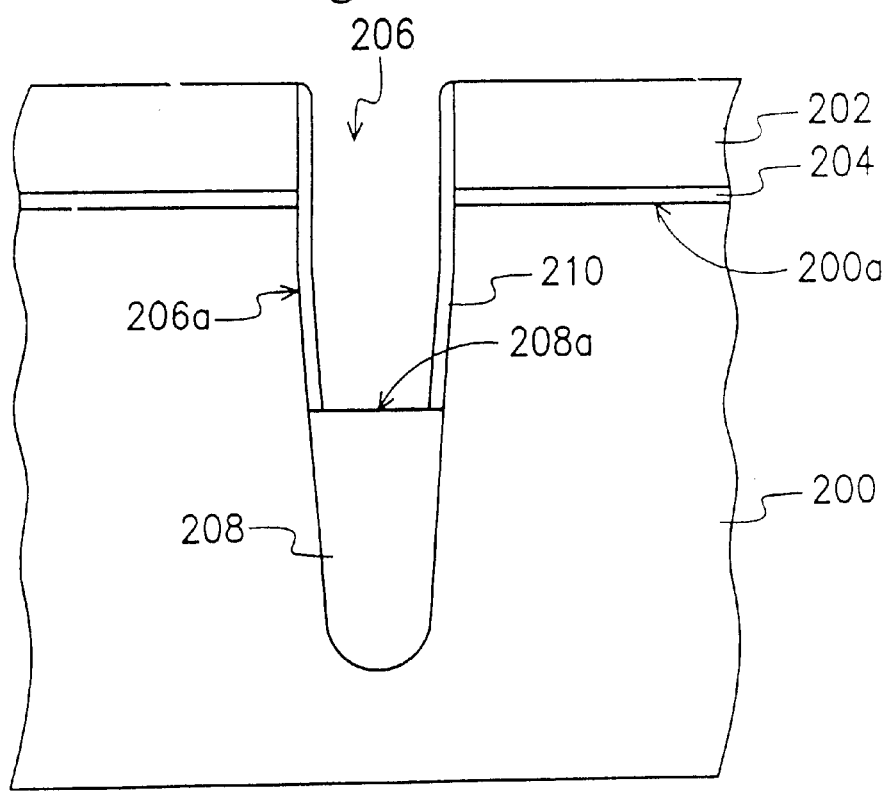

FIG. 2C shows that a sidewall spacer 210 is formed in the deep trench above the surface 208a of the first dielectric material 208. The sidewall spacer is formed by a conformal deposition of a hard silicon nitride followed by anisotropic etching to a thickness of about 200 Å.

Figure 2D:
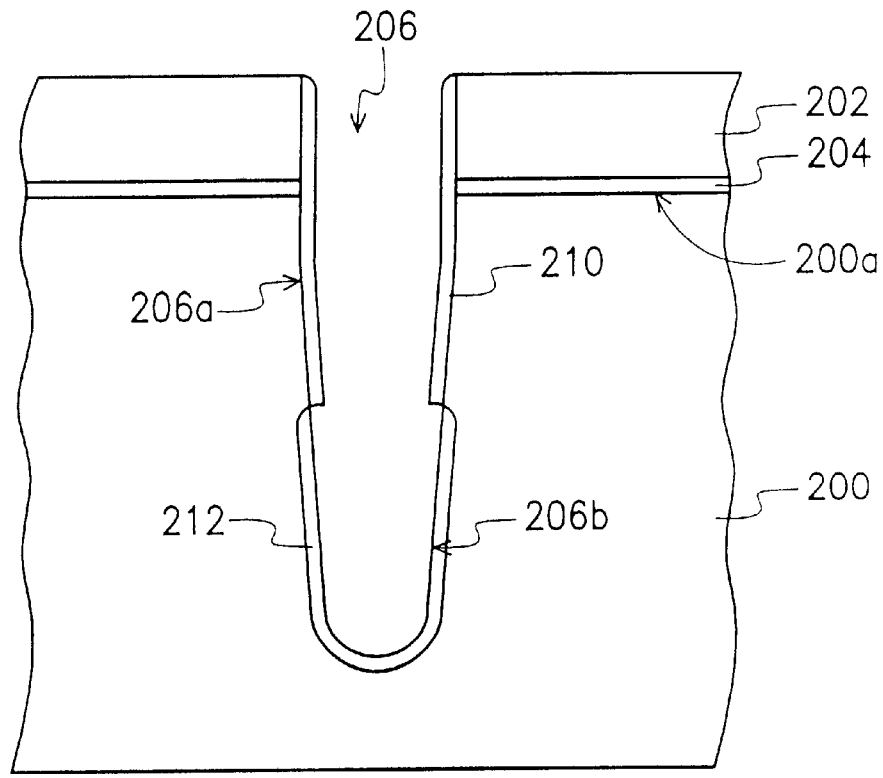
Figure 2E:
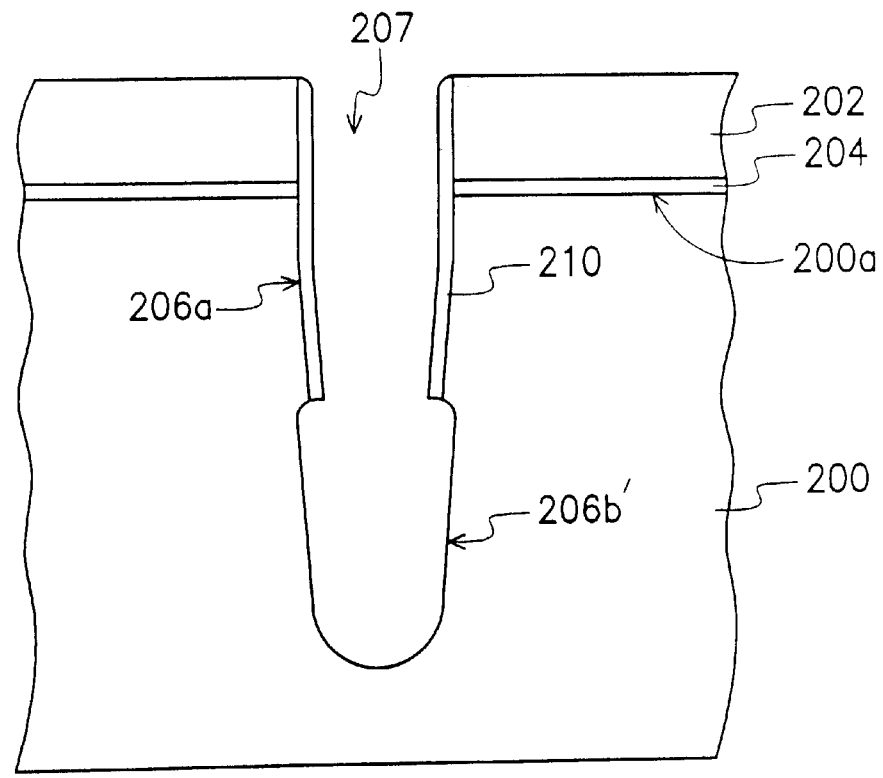

FIG. 2D shows that after the removal the first dielectric layer, the exposed portion 206b of the substrate in the deep trench is oxidized, using the sidewall spacer 210 as a mask, to a predetermined distance into the substrate 200. This is done by first removing the first dielectric layer by a selective etching method which does not affect the sidewall spacer. This leaves the bottom portion 206b of the deep trench, i.e., the portion intended to be enlarged, to be exposed. Then utilizing the sidewall space as a mask, the exposed portion of the substrate in the deep trench is oxidized using an RTP process under an oxygen environment. The oxidized substrate 212, i.e., silicon oxide, is then removed by wet etching, thereby causing the bottom portion of the deep trench to be enlarged, as shown in FIG. 2E.

Figure 2F:
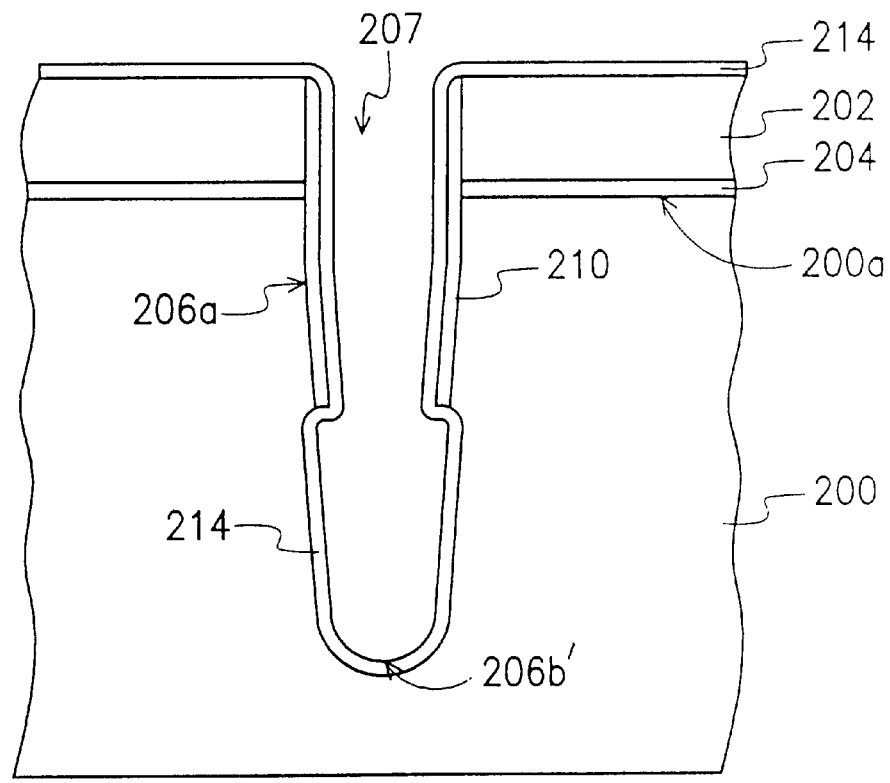
Figure 2G:
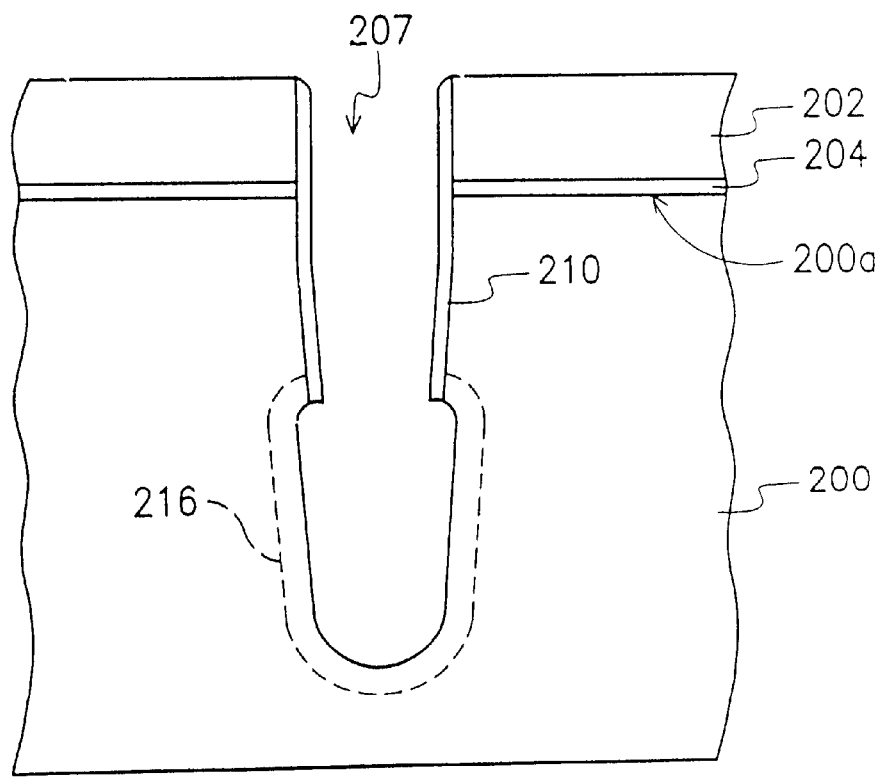

FIG. 2F shows that a conformal heavily arsenic-ion-doped layer 214 is formed which covers the surface of the deep trench including the sidewall spacer, 210 using a combined in-situ ion-doping and chemical vapor deposition technique. The substrate is heated causing the arsenic ions to diffuse into the substrate in the deep trench not covered by the sidewall spacer, the diffused region becomes the first conductive plate 216, as shown in FIG. 2G. FIGS. 2F and 2G show that the top or neck portion 207 of the deep trench is protected by the hard sidewall spacer 210. After diffusion, the entire ion-doped layer is removed using BHF (buffered hydrofluoric acid) or DHF (diluted hydrofluoric acid) etching. Because the diffused layer is formed as if it were pushed away from the original trench surface (inwardly into the substrate), it results in about 50% to 100% increase in the surface of the deep trench capacitor.

Figure 2H:
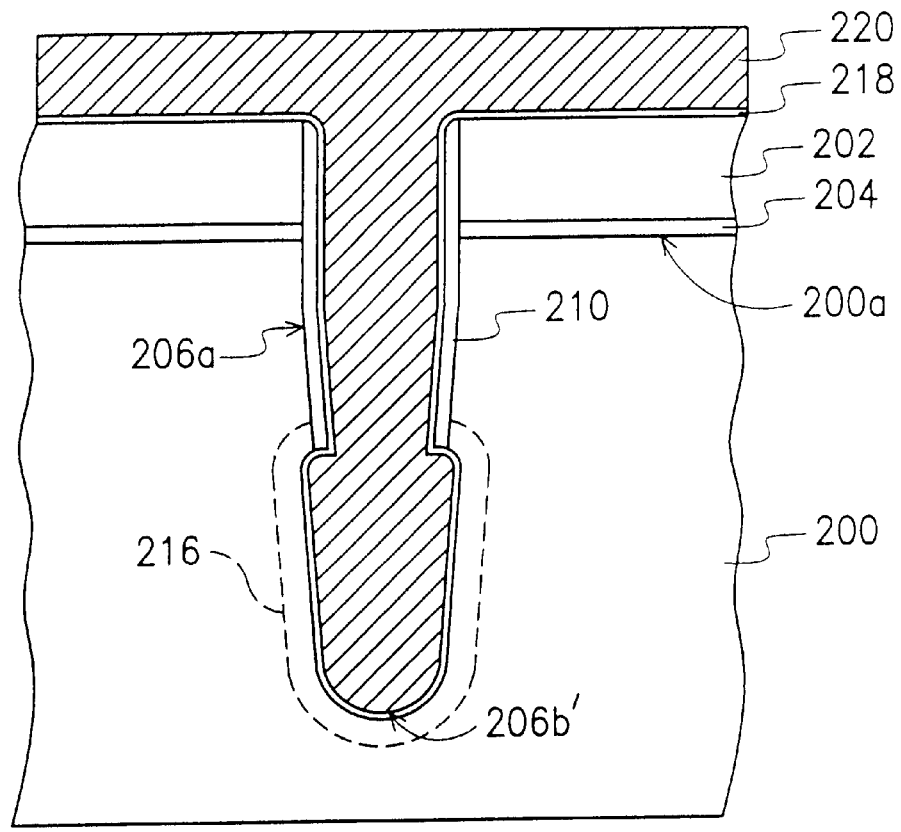
Figure 2I:
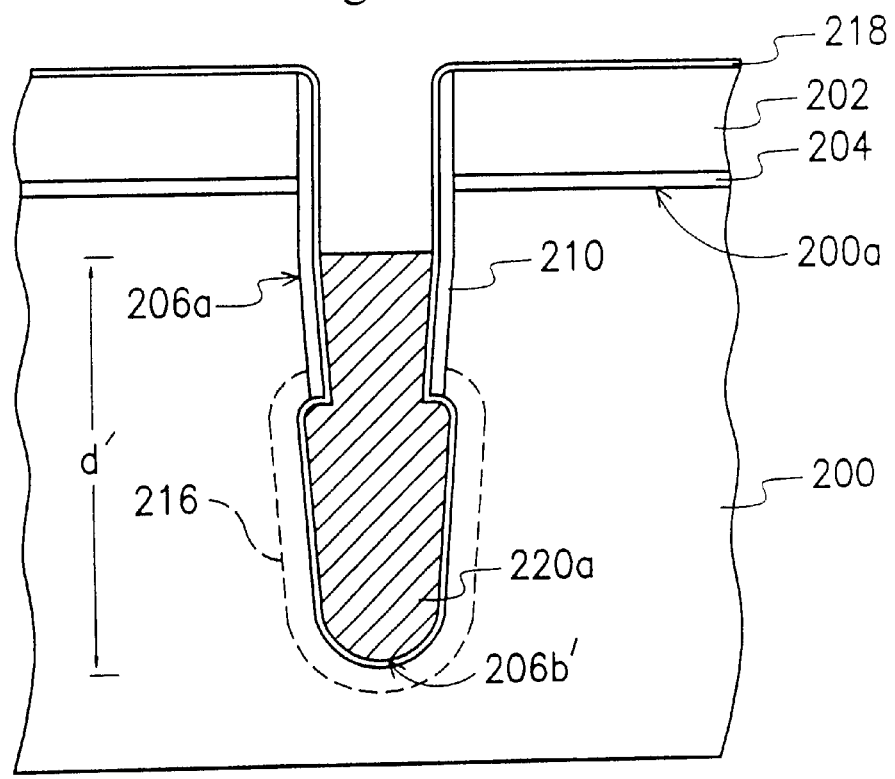

FIG. 2H shows that after the formation of a conformal second dielectric layer 218 which covers the surface of the deep trench including the sidewall spacer, the deep trench is filled with a first conductive material 220 covering the substrate as well as the hard mask 202. Thereafter, the first conductive material 220a is controlledly etched to a second predetermined depth d' which is above the first predetermined depth d, as shown in FIG. 2I.

Figure 2J:
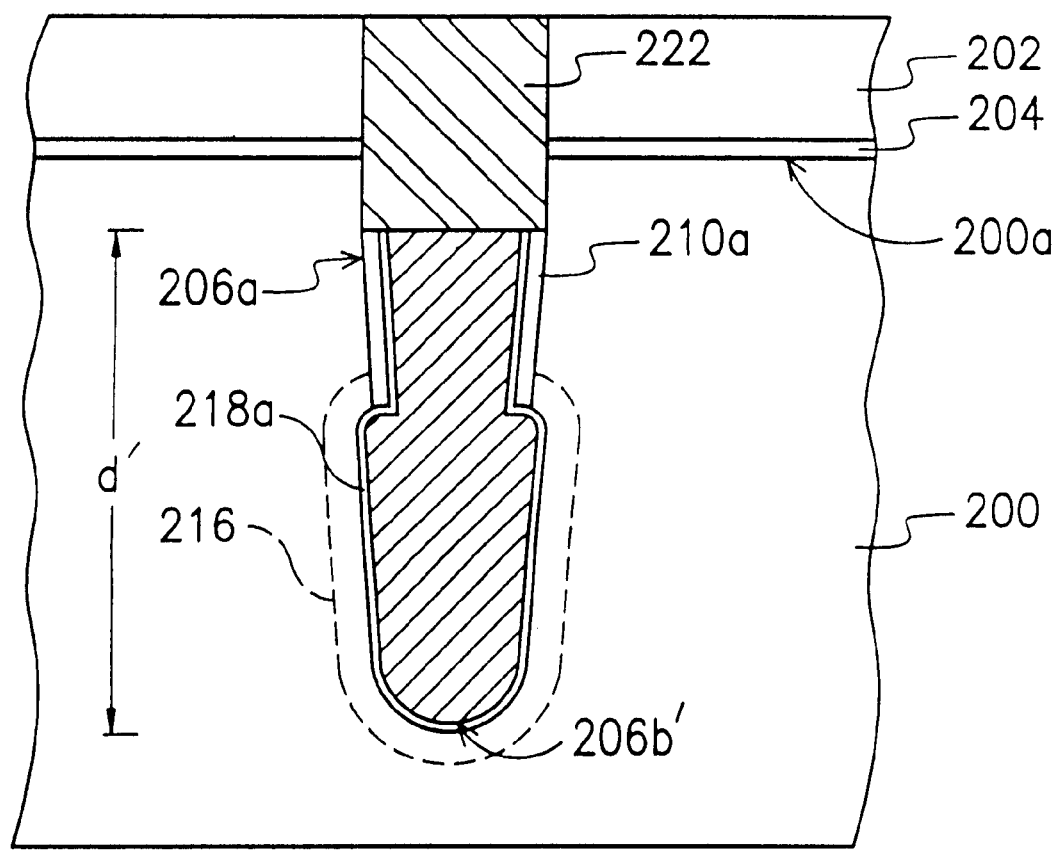

FIG. 2J shows that, after the removal of the second dielectric layer above the second predetermined depth, the deep trench is filled with a second conductive material 222. This is achieved by first filling the deep trench with a second conductive material. Excess amount of the second conductive material is removed by chemical-mechanical polishing (CMP) so as to be flat with the hard mask 202. The second conductive material 222 is in contact with the substrate 200. FIG. 2J also shows that the first conductive plate 216 is insulated from the second conductive plate by the remaining portion of the conformal second dielectric layer 218a and the remaining portion of the sidewall spacer.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating bottle-shaped deep trench capacitors comprising the steps of:
    (a) using a photolithography process to form a deep trench into a semiconductive substrate;
    (b) partially filling said deep trench with a first dielectric material to form a first dielectric layer having a first predetermined depth;
    (c) forming a sidewall spacer in said deep trench above said dielectric layer, said sidewall spacer being made from a second dielectric material having a different etchability from said first dielectric material and allowing low diffusion rate for ions;
    (d) removing said first dielectric layer, leaving said portion of said substrate below said sidewall spacer to be exposed;
    (e) using said sidewall spacer as a mask, causing said exposed portion of said substrate in said deep trench to be oxidized, then removing said oxidized substrate;
    (f) forming an ion-doped conformal layer around sidewalls of said deep trench, including said sidewall spacer;
    (g) heating said substrate to cause said doping ions to diffuse into said substrate to form a diffused region in said deep trench not covered by said sidewall spacer, wherein said diffused region becomes said first conductive plate;
    (h) removing the entire ion-doped layer;
    (i) forming a conformal second dielectric layer covering a surface of said deep trench including said sidewall spacer, then filling said deep trench with a first conductive material to a second predetermined depth which is above said first predetermined depth;
    (j) removing said sidewall spacer and said second dielectric layer above said second predetermined depth; and
    (k) filling said deep trench with a second conductive material, wherein said first and second conductive materials collectively form a second conductive plate.

2. The method for fabricating bottle-shaped deep trench capacitors according to claim 1 which further comprises the step of forming a pad oxide layer and a hard mask layer prior to forming said deep trench.

3. The method for fabricating bottle-shaped deep trench capacitors according to claim 1 wherein said step (b) of partially filling said deep trench with a first dielectric material is achieved by filling said deep trench with said first dielectric material, then etching the first dielectric material to said first predetermined depth.

4. The method for fabricating bottle-shaped deep trench capacitors according to claim 1 wherein said sidewall spacer comprises silicon nitride.

5. The method for fabricating bottle-shaped deep trench capacitors according to claim 1 wherein said sidewall spacer is formed by depositing a conformal dielectric layer on the side wall surface of said deep trench, followed by anisotropic etching.

6. The method for fabricating bottle-shaped deep trench capacitors according to claim 1 wherein said ion-doped layer contains arsenic ions.

7. The method for fabricating bottle-shaped deep trench capacitors according to claim 1 wherein said oxidized substrate in step (e) has a thickness of about 500 to 1,000 Å.

8. The method for fabricating bottle-shaped deep trench capacitors according to claim 1 wherein said ion-doped layer is removed using buffered hydrofluoric acid or diluted hydrofluoric acid in step (h).

9. The method for fabricating bottle-shaped deep trench capacitors according to claim 1 wherein said step (i) of filling said deep trench with a first conductive material to a second predetermined depth is achieved by filling said deep trench with said first conductive material followed by controlled etching.

* * * * *